(12) United States Patent
Brouqui et al.

(10) Patent No.: US 12,429,512 B2
(45) Date of Patent: Sep. 30, 2025

(54) METHOD FOR DETECTING A MALFUNCTION SUFFERED BY AN INTEGRATED DRIVE GENERATOR, IN AN AIRCRAFT

(71) Applicant: Airbus Operations SAS, Toulouse (FR)

(72) Inventors: Manon Brouqui, Toulouse (FR); Matthieu Bradier, Toulouse (FR); Eric Benhamou, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 198 days.

(21) Appl. No.: 18/469,268

(22) Filed: Sep. 18, 2023

(65) Prior Publication Data
US 2024/0094277 A1    Mar. 21, 2024

(30) Foreign Application Priority Data
Sep. 19, 2022   (FR) ...................................... 2209447

(51) Int. Cl.
| | | |
|---|---|---|
| *G01R 31/00* | (2006.01) | |
| *B64D 45/00* | (2006.01) | |
| *G01R 31/34* | (2020.01) | |
| *H02K 11/20* | (2016.01) | |

(52) U.S. Cl.
CPC ........... *G01R 31/008* (2013.01); *G01R 31/34* (2013.01); *H02K 11/20* (2016.01); *B64D 2045/0085* (2013.01)

(58) Field of Classification Search
None
See application file for complete search history.

(56) References Cited

U.S. PATENT DOCUMENTS

| | | |
|---|---|---|
| 2020/0250905 A1 | 8/2020 | Sundareswara et al. |
| 2020/0382031 A1* | 12/2020 | Higgins .................... H02P 9/42 |

FOREIGN PATENT DOCUMENTS

EP    3460611 A1    3/2019

OTHER PUBLICATIONS

French Search Report for corresponding French Patent Application No. 2209447 dated Apr. 21, 2023.
(Continued)

*Primary Examiner* — Farhana A Hoque
(74) *Attorney, Agent, or Firm* — Greer, Burns & Crain, Ltd.

(57) ABSTRACT

A data analysis system comprises an artificial intelligence of the machine learning type. The data analysis system collects reference data relating to measurements made and recorded during previous flights of aircraft. A training of the artificial intelligence of the machine learning type is implemented by virtue of reference data, with a first classification run for training to detect potential malfunctions suffered by integrated drive generators and a second classification run for training to determine causes of the malfunctions, where relevant. After using in production, the data analysis system collects data to be analyzed relating to measurements made and recorded during flights of the aircraft comprising an integrated drive generator to be monitored, and uses the artificial intelligence of the machine learning type to predict a potential malfunction and, where relevant, predict its cause using data to be analyzed.

11 Claims, 4 Drawing Sheets

(56) References Cited

OTHER PUBLICATIONS

B. K. Bailey, "Fault Diagnosis Via Univariate Frequency Analysis Monitoring: A Novel Technique Applied to a Simulated Integrated Drive Generator" retrieved from the Internet: https://trace.tennessee.edu/cgi/viewcontent.cgi?article=2185&context=utk_gradthes.

* cited by examiner

METHOD FOR DETECTING A MALFUNCTION SUFFERED BY AN INTEGRATED DRIVE GENERATOR, IN AN AIRCRAFT

CROSS-REFERENCES TO RELATED APPLICATIONS

This application claims the benefit of French Patent Application Number 2209447 filed on Sep. 19, 2022, the entire disclosure of which is incorporated herein by way of reference.

FIELD OF THE INVENTION

The present invention relates to the field of the detection of a malfunction suffered by an integrated drive generator (IDG) in an aircraft.

BACKGROUND OF THE INVENTION

In an aircraft, an IDG is a system associated with each jet engine in order to convert the kinetic energy of the said jet engine into electrical energy for supplying electricity to the aircraft. The IDG potentially supplies electrical power to all the electrical loads of the aircraft.

The IDG is composed of an alternator and of a constant speed drive (CSD) installed within the same housing. The CSD is a mechanical device allowing a constant frequency of rotation to be obtained at the input of the alternator despite the variations in speed of rotation of the jet engine. Thus, the IDG can deliver a fixed frequency (for example, 400 Hz) to the electrical supply system of the aircraft.

Oil is a vital component of the IDG, and the adherence of the characteristics of this oil, notably its temperature, to the specifications is an essential parameter for the longevity and the efficiency of the IDG. If this is not the case, it is considered that the IDG has suffered a malfunction, which it is desirable to detect.

The oil used for the cooling the IDG circulates in a closed circuit and is cooled, by means of an oil cooler, by virtue of the fuel supplying the jet engine with which the IDG is associated. In the same way, a heat exchanger is used to cool the oil used for the lubrication of the jet engine itself. The heat exchanges allowing the cooling of these oils therefore depend on the flow of fuel supplying the jet engine in question.

However, since during certain phases of flight, and more particularly in the descent phase, the fuel requirements of the jet engine are reduced, the fuel supplying the jet engine may not be sufficient for the cooling these oils, which reduces the longevity and the performance of the IDG.

In order to take into account this aspect, a fuel return valve (FRV) is used, in such a manner as to increase the flow of fuel so as to maintain the cooling. The FRV controls the flow of fuel from a system for distribution of fuel to the jet engine then to a recirculation system returning the hot fuel to the fuel tank of the aircraft. When the FRV is in the closed position, the recirculation system is inhibited.

The result of the above is that, when the FRV suffers a malfunction, whether this be due to a failure of the FRV itself or to a failure of another mechanism with which the IDG interacts, directly or indirectly, such as a sensor or the FRV, the IDG itself suffers a malfunction, and the longevity and the performance of the IDG could consequently be reduced.

It is thus desirable to overcome these drawbacks of the prior art. It is notably desirable to provide a solution which allows a malfunction suffered by the IDG to be detected. It is furthermore desirable to provide a solution which allows the cause of the malfunction detected to be identified. It is furthermore desirable to provide a solution that is simple and low cost.

SUMMARY OF THE INVENTION

For this purpose, a method is provided for detection of a malfunction suffered by an integrated drive generator, referred to as IDG to be monitored, in an aircraft, the method being implemented by a data analysis system comprising an artificial intelligence of the machine learning type. The method comprises: collecting reference data relating to measurements carried out and recorded during previous aircraft flights equipped with IDGs, referred to as reference IDGs, the reference data comprising at least measurements corresponding to the following parameters, for each reference IDG: flow of fuel supplying a jet engine with which the reference IDG in question is associated; position of a fuel return valve associated with the reference IDG in question; temperature measured by a sensor on the inlet port of the reference IDG in question; temperature measured by a sensor on the outlet port of the reference IDG in question; electrical signal frequency produced by the reference IDG in question; temperature of oil supplying the jet engine with which the reference IDG in question is associated. The method furthermore comprises: performing a training, in supervisor mode, of the artificial intelligence of the machine learning type by virtue of the reference data, with a first classification run for training to detect potential malfunctions suffered by IDGs and a second classification run for training to determine causes of the malfunctions, where present; running the artificial intelligence of the machine learning type in production after validation of the training; collecting data to be analyzed, of the same type as the reference data, relating to measurements carried out and recorded during flights of the aircraft comprising the IDG to be monitored; using the artificial intelligence of the machine learning type that has been trained, and thus predicting a potential malfunction suffered by the IDG to be monitored and predicting, where relevant, a cause of the malfunction, by virtue respectively of said first and second runs, using the data to be analyzed. Thus, the IDG malfunction may be readily predicted and, where relevant, its cause may also be readily predicted.

In one particular embodiment, the reference data furthermore comprise measurements corresponding to at least one of the following parameters, for each reference IDG: time during which the fuel return valve is open; time during which the fuel return valve is closed; ratio between the time during which the fuel return valve is closed and the time during which the fuel return valve is open; time taken by the fuel return valve to go from the closed position to the open position; difference in temperature between the inlet port of the reference IDG in question and outlet port of the reference IDG in question.

In one particular embodiment, the data analysis system applies a processing to the reference data and to the data to be analyzed, the processing applied corresponding at least to the calculation of the following information, potentially in combination, for one or more of the said parameters minimum value; maximum value; standard deviation; average; moving average; gradient coefficient.

In one particular embodiment, the calculation of at least a part of said information is carried out by grouping reference data and, respectively, data to be analyzed, over several consecutive aircraft flights.

In one particular embodiment, the artificial intelligence of the machine learning type is trained to detect an IDG malfunction linked to: an anomaly in the opening/closing controls of the fuel return valve; a clogging of IDG oil; a failure of the temperature sensor on the IDG outlet port; a failure of temperature sensor on the IDG inlet port; an IDG oil leak; an IDG maintenance anomaly.

In one particular embodiment, the first classification run is carried out by applying a first algorithm and the second classification run is carried out by applying a second algorithm distinct from the first algorithm.

In one particular embodiment, the first algorithm is of the LightGBM type and the second algorithm is of the XGBooost type.

A computer program product is also provided, which may be stored on a medium and/or downloaded from a communications network in order to be read by a processor. This computer program comprises instructions for implementing the method mentioned hereinabove in any one of its embodiments, when said program is executed by the processor. A non-volatile information storage medium is also provided on which such a computer program is stored.

In one particular embodiment, the artificial intelligence of the machine learning type is implemented in an avionics system of the aircraft equipped with the IDG to be monitored.

In one particular embodiment, the artificial intelligence of the machine learning type is implemented in a computer system on the ground in a control center, and the data to be analyzed are transmitted by an avionics system of the aircraft, equipped with the IDG to be monitored, to the computer system in the control center.

A data analysis system is also provided comprising an artificial intelligence of the machine learning type, the system comprising electronic circuitry configured for carrying out a detection of malfunction suffered by an integrated drive generator, or IDG to be monitored, in an aircraft. The electronic circuitry is configured for collecting reference data relating to measurements made and recorded during previous aircraft flights equipped with IDGs, or reference IDGs, the reference data comprising at least measurements corresponding to the following parameters, for each reference IDG: flow of fuel supplying a jet engine with which the reference IDG in question is associated; position of a fuel return valve associated with the reference IDG in question; temperature measured by a sensor on the inlet port of the reference IDG in question; temperature measured by a sensor on the outlet port of the reference IDG in question; frequency of electrical signal produced by the reference IDG in question; temperature of oil supplying the jet engine with which the reference IDG in question is associated. The electronic circuitry is furthermore configured for: carrying out a training, in supervisor mode, of the artificial intelligence of the machine learning type by virtue of the reference data, with a first classification run for training to detect potential malfunctions suffered by IDGs and a second classification run for training to determine causes of the malfunctions, where relevant; run the artificial intelligence of the machine learning type in production after validation of the training; collect data to be analyzed, of the same type as the reference data, relating to measurements made and recorded during flights of the aircraft comprising the IDG to be monitored; use the artificial intelligence of the machine learning type that has been trained, and thus predict a potential malfunction suffered by the IDG to be monitored and predict, where relevant, a cause of the malfunction by virtue, respectively, of the said first and second runs, using the data to be analyzed.

BRIEF DESCRIPTION OF THE DRAWINGS

The features of the invention mentioned hereinabove, together with others, will become more clearly apparent upon reading the following description of at least one exemplary embodiment, said description being presented in relation with the appended drawings, amongst which.

DETAILED DESCRIPTION OF THE PREFERRED EMBODIMENTS

Figure 1:
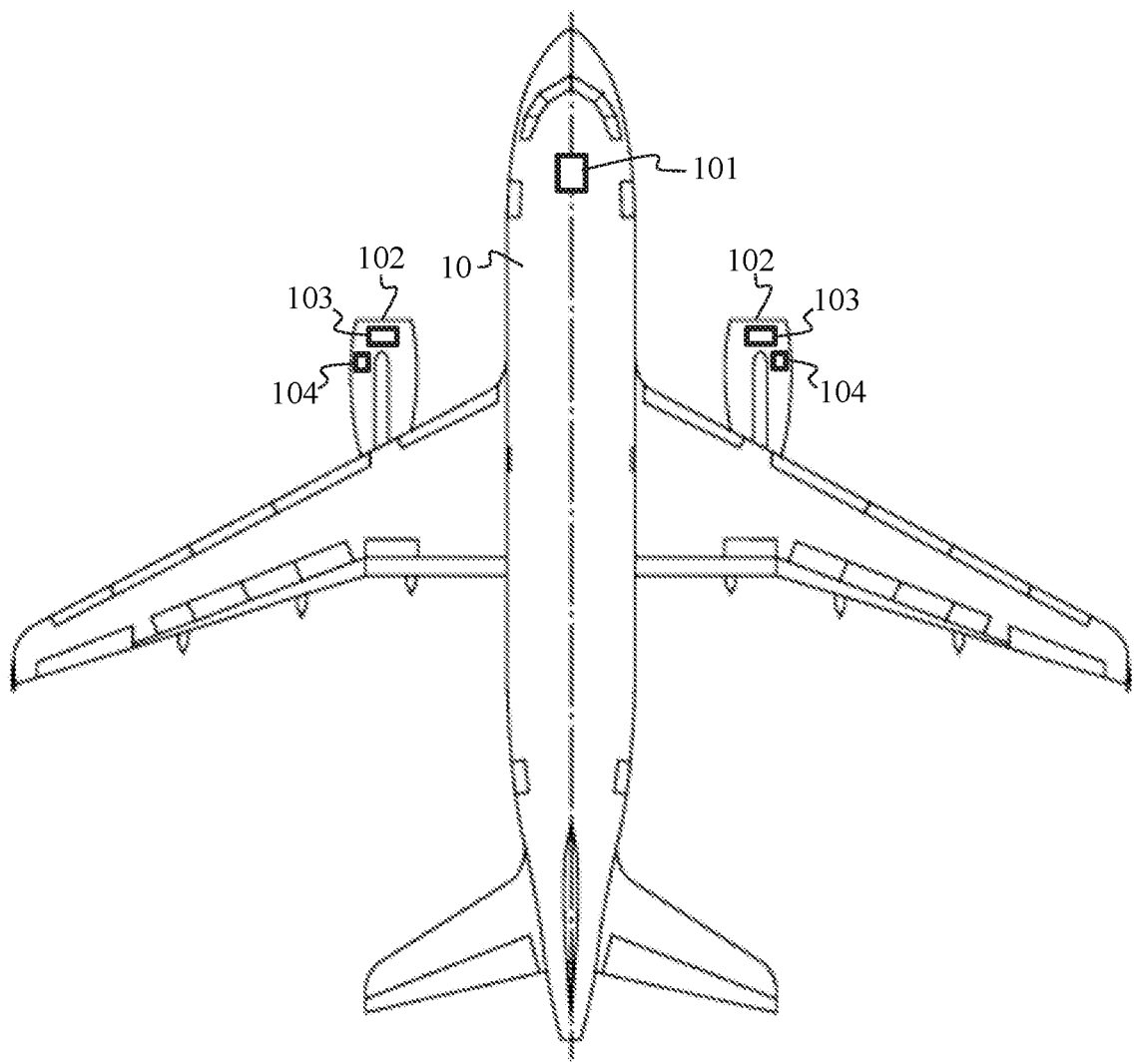
FIG. 1 illustrates schematically, as a top view, an aircraft equipped with jet engines respectively fitted with integrated drive generators IDG.

FIG. 1 thus illustrates schematically, as a top view, an aircraft 10. The aircraft 10 comprises at least one jet engine 102, preferably of the turbojet type. Each jet engine 102 is equipped with an integrated drive generator IDG 103. Each jet engine 102 is also preferably equipped with a generator control unit GCU whose main functions are to regulate and to monitor the frequency and the voltage of the alternator of the IDG 103 of the jet engine 102 in question, to monitor the "feeder" faults, the overloads and the phase inversions, and to protect the electrical supply system of the aircraft 10 by controlling an associated generator line contactor GLC. Each GCU is connected to the avionics 101 of the aircraft 10, more particularly to an electronic centralized aircraft monitoring ECAM system, so as to supply warning signals as needed, notably in the cockpit of the aircraft 10.

Each IDG 103 is conventionally equipped with two oil temperature sensors: an oil temperature sensor on the inlet port and another oil temperature sensor on the outlet port. These sensors are typically thermistors. By virtue of these sensors, the GCU associated with the IDG 103 in question monitors the temperature of the oil of the IDG 103 and supplies an warning signal in the case of exceeding a predefined temperature threshold on one and/or the other of these two oil temperature sensors.

Each IDG 103 is preferably associated with a fuel return valve FRV 104 which controls the flow of fuel, notably used for the cooling of the oil of the IDG 103, from a system for distributing fuel to the jet engine 102, with which the IDG 103 is associated, to a recirculation system returning the hot fuel to a fuel tank of the aircraft in order to allow cooler fuel coming from the said fuel tank of the aircraft to be injected into the fuel distribution system. The FRV 104 also controls the said flow of fuel for the cooling of the oil of the said jet engine 102. Thus, the oil of the IDG 103 in question and the oil of the said jet engine 102 are better cooled. It should be noted that the jet engines 102 are fitted with sensors for temperature of the oil feeding them.

A malfunction of these temperature sensors or of the FRV 104, or of a fuel level sensing control unit FLSCU, or of any other mechanism with which the IDG 103 in question interacts, directly or indirectly, may lead to a malfunction, sometimes over a long period, of the IDG 103. In order to detect potential malfunctions of the IDG 103 in question and to find their causes, a data analysis system is used. The data analysis system is based on an artificial intelligence of the machine learning type, such as an artificial neural network or a support vector machine SVM, as described hereinafter.

Figure 2A:
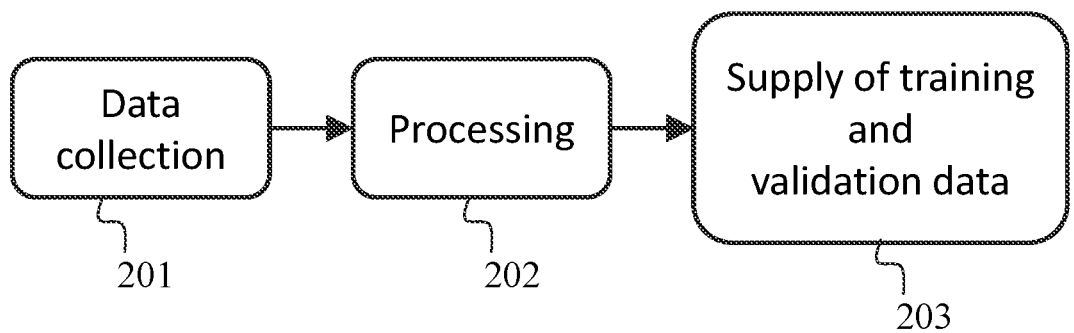
FIG. 2A illustrates schematically an algorithm for obtaining data usable for training and validating an artificial intelligence of the machine learning type.

FIG. 2A illustrates schematically an algorithm for obtaining data usable for training and for validating the artificial intelligence of the machine learning type.

In a step 201, the data analysis system carries out a collection of reference data relating to measurements made and recorded during aircraft flights. The data comprise at least measurements relating to the operation and parametrization of the IDGs 103 of these aircraft and of any other mechanism with which these IDGs 103 interact, directly or indirectly. Preferably, the measurements correspond at least to the following parameters, for each IDG 103 concerned:

Flow of fuel supplying the jet engine 102 with which the IDG 103 in question is associated;
Position (open/closed) of the FRV 104 associated with the IDG 103 in question;
Temperature measured by the sensor on the inlet port of the IDG 103 in question;
Temperature measured by the sensor on the outlet port of the IDG 103 in question;
Frequency of the electrical signal produced by the IDG 103 in question;
Temperature of the oil supplying the jet engine 102 with which the IDG 103 in question is associated.
In one particular embodiment, the list of parameters hereinabove is completed by the following parameters:
Time during which the fuel return valve is open;
Time during which the fuel return valve is closed;
Ratio between the time during which the fuel return valve is closed and the time during which the fuel return valve is open;
Time taken by the fuel return valve to go from a closed position to an open position;
Difference in temperature between the inlet port of the IDG and outlet port of the IDG.

In a step 202, the data analysis system preferably performs a processing on the data collected at the step 201. The processing comprises, for example, selection, transformation, aggregation and combination operations. Preferably, the processing applied corresponds at least to a calculation of the following information, potentially in combination, for one or more of the parameters listed hereinabove:

Minimum value;
Maximum value;
Standard deviation;
Average;
Moving average;
Gradient coefficient.

In one particular embodiment, the calculation of at least a part of the said information is carried out by grouping reference data and, respectively, data to be analyzed, over several consecutive aircraft flights. For example, the data processing generates a moving average, over a predefined number of consecutive aircraft flights, of the difference in temperature between IDG 103 inlet port and IDG 103 outlet port (e.g., temperature on the inlet port minus temperature on the outlet port). According to another example, the data processing produces a gradient coefficient of the moving average, over a predefined window of consecutive aircraft flights, of the average (per flight or by segment of cruising flight) of the difference in temperature between IDG 103 inlet port and IDG 103 outlet port (e.g., temperature on the inlet port minus temperature on the outlet port). According to another example, the data processing results in a gradient coefficient, over a predefined number of consecutive aircraft flights, of the maximum value (or minimum value, or of the average, or of the standard deviation) of the difference in temperature between IDG 103 inlet port and IDG 103 outlet port (e.g., temperature on the inlet port minus temperature on the outlet port).

In a step 203, the data analysis system supplies a set of data, coming from the data collected and preferably coming from the processing in the step 202, usable for the training and the validation of the artificial intelligence of the machine learning type.

Figure 2B:
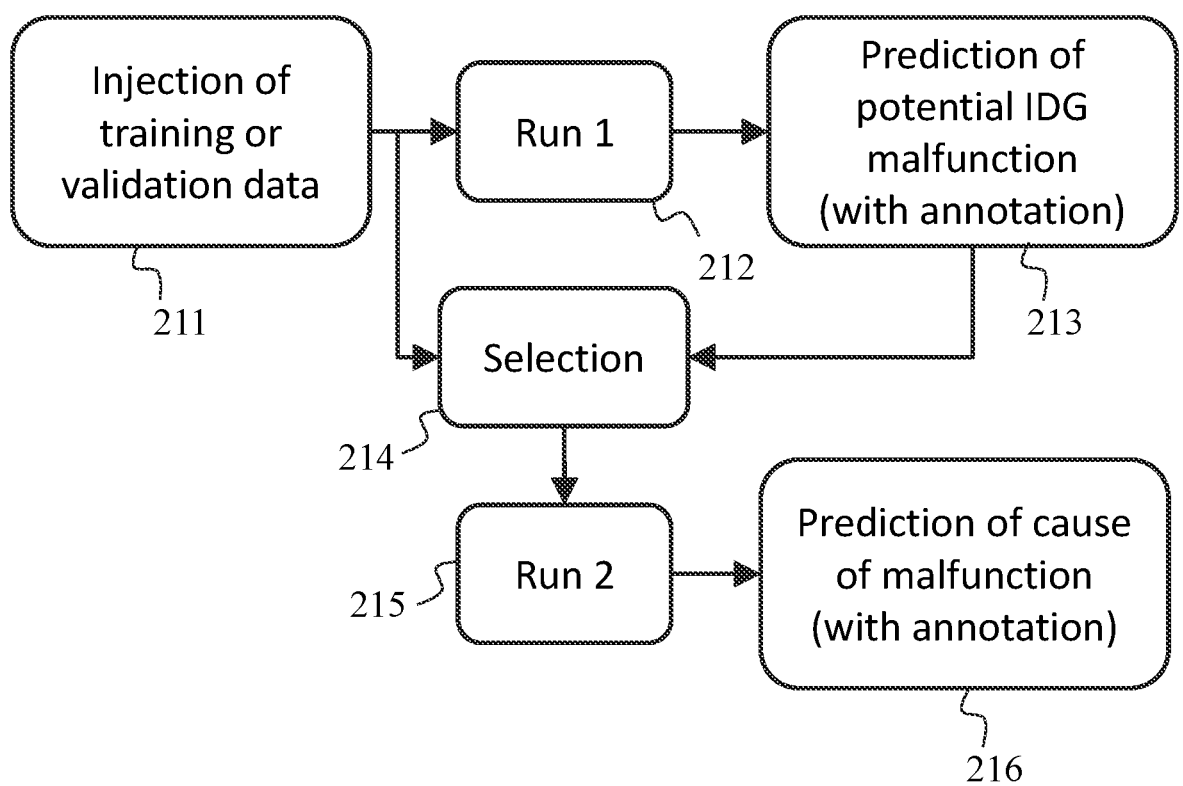
FIG. 2B illustrates schematically an algorithm for training and for validating the artificial intelligence of the machine learning type.

FIG. 2B illustrates schematically an algorithm for training and validating the artificial intelligence of the machine learning type.

In a step 211, the data analysis system injects a set of training data into the input of the artificial intelligence of the machine learning type. The data set supplied in the step 203 is separated into two sets of data: the set of training data and a set of validation data.

The training of the artificial intelligence of the machine learning type is carried out in a supervised manner. In other words, a human operator annotates the data of the data set in question, in order to indicate to the artificial intelligence of the machine learning type the expected classification for the data injected into the input. The artificial intelligence of the machine learning type configures itself taking into account the data injected into the input and the annotation provided. The data are classified in light of malfunctions potentially observed at a later date on the IDG 103 concerned by the data collected.

Preferably, the data are classified with an indication of the time passed or numbers of flights carried out between the measurements in question and the observation of the malfunction. This allows the artificial intelligence to learn to predict the occurrence of malfunctions impacting the IDG 103.

The training is carried out along two classification axes. A first classification axis relates to the detection or the prediction of an IDG 103 malfunction. A second classification axis relates to, in the case of detection or prediction of an IDG 103 malfunction, the prediction of a cause of the IDG 103 malfunction.

For this purpose, in a step 212, the data analysis system carries out a first classification run on the data set injected. The classification trained for this first run relates to the detection or the prediction of an IDG 103 malfunction. For example, the first run is implemented by virtue of a first decisional algorithm. In one particular embodiment, the first run is implemented with an algorithm of the LightGBM (Light Gradient Boosting Machine) type. LightGBM is well adapted to the first run owing to its speed of execution and its reliability with a large input data set (availability of failure reports coming from previous flights).

Thus, in a step 213, depending on the first run, the data analysis system obtains a prediction with regard to the malfunction of the IDG 103 in question, for the injected data, in light of the annotation supplied for the training.

In order to be able to learn the cause of the malfunctions, where relevant, the data analysis system carries out a second classification run on a selection (step 214) from amongst the data set, the selection corresponding to the injected data which have been annotated as representative of a malfunction of the IDG 103. For example, the second run is implemented by virtue of a second decisional algorithm, different from the first decisional algorithm. In one particular embodiment, the second run is implemented with an algorithm of the XGBoost type. XGBoost is well adapted to the second run owing to its high reliability with a more limited input data set (due to the selection subsequent to the first run).

Thus, in a step 216, depending on the second run, the data analysis system obtains a prediction with regard to the cause of the malfunction of the IDG 103 in question, for the injected data, in light of the annotation supplied for the training.

In order to verify that the artificial intelligence of the machine learning type has been adequately configured by the training carried out, a new cycle is implemented, in which the validation data set is injected in the step 211. In the framework of the validation, the injected data are not subject to annotation, and the artificial intelligence of the machine learning type carries out by itself the classification expected by the first and second runs. If the artificial intelligence of the machine learning type carries out the classification as expected, then the data analysis system may be used in production, in other words used to detect potential malfunctions of an integrated drive generator and, in which case, to find their causes; otherwise, a new training has to be implemented.

Thus, by virtue of a suitable training, the artificial intelligence of the machine learning type may be readily configured, by basing it on reports of faults coming from previous flights, for detecting IDG 103 malfunctions linked to:

An anomaly of FRV 104 opening/closing controls;
A clogging of IDG 103 oil;
A failure of a temperature sensor on the IDG 103 outlet port;
A failure of a temperature sensor on the IDG 103 inlet port;
An oil leak in the IDG 103;
An IDG 103 maintenance anomaly.

The artificial intelligence of the machine learning type may be trained to detect other types of causes of IDG 103 malfunctions.

Figure 3A:
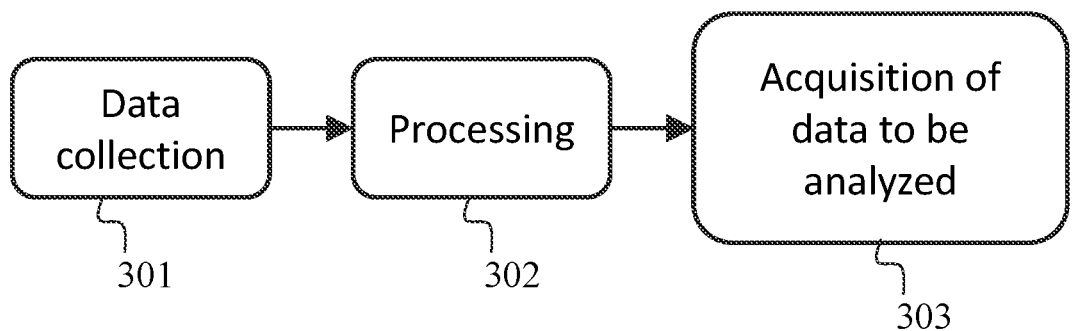
FIG. 3A illustrates schematically an algorithm for obtaining data to be analyzed by the artificial intelligence of the machine learning type, in order to detect potential malfunctions of an integrated drive generator and, in which case, to find its causes.

FIG. 3A illustrates schematically an algorithm for obtaining data to be analyzed by the artificial intelligence of the machine learning type.

Once the data analysis system is in production, the aim of its use is to detect or to predict the occurrence of an IDG 103 malfunction and, in which case, to establish its cause.

Measurements are made during the flights of aircraft in order to collect, in a step 301, data allowing each IDG 103 of the said aircraft to be monitored. The measurements in question supply data of the same type as that collected at the step 201 for initiating the training of the artificial intelligence of the machine learning type.

In a step 302, the data analysis system carries out a processing on the data collected at the step 301. The processing applied to the step 302 is identical to that applied at the step 202, in order to obtain, in a step 303, data to be analyzed of the same type and of the same nature as that obtained at the step 203.

Figure 3B:
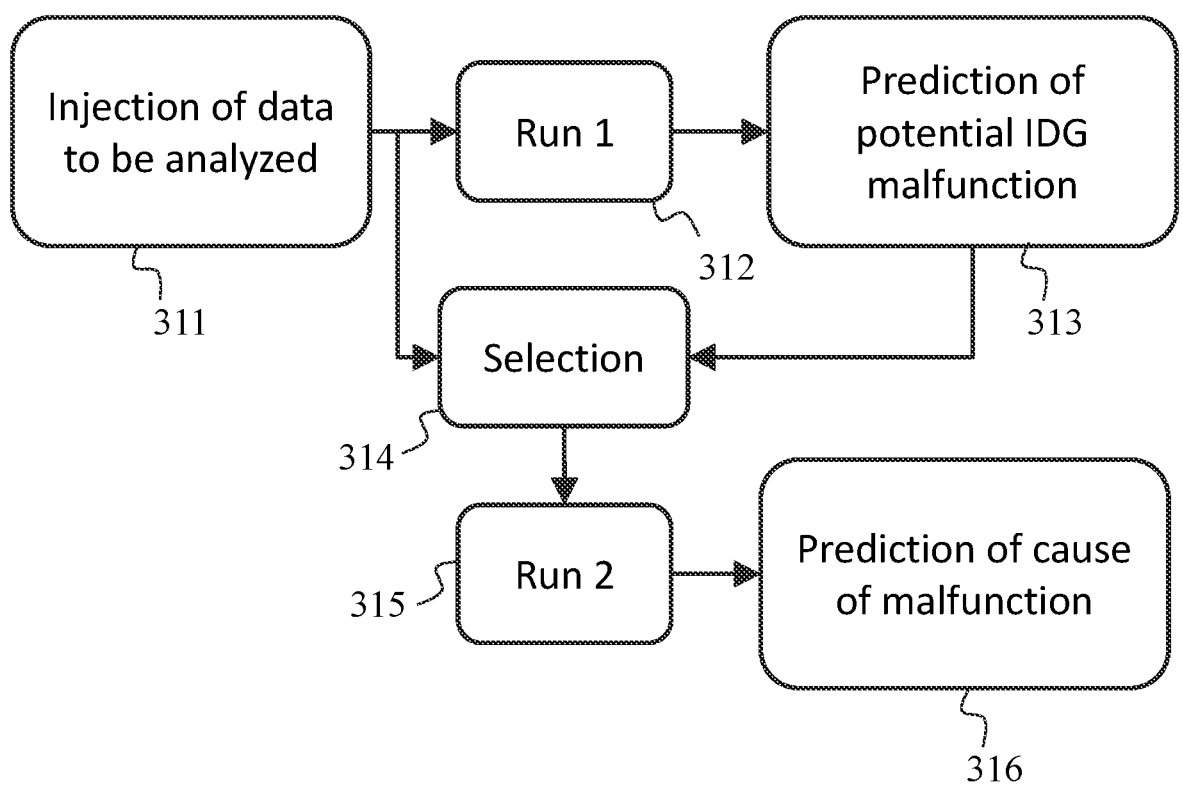
FIG. 3B illustrates schematically an algorithm for data analysis by the artificial intelligence of the machine learning type, in order to detect the potential malfunctions of an integrated drive generator and, in which case, to find their causes.

FIG. 3B illustrates schematically an algorithm for data analysis by the artificial intelligence of the machine learning type.

In a step 311, the data analysis system injects data to be analyzed, such as obtained at the step 303, into the input of the artificial intelligence of the machine learning type. In contrast to the training phase, it is not known here whether the data are indicative of a malfunction suffered by the IDG 103 in question or not.

In a step 312, the data analysis system carries out a first classification run on the injected data. As for the training, this first run relates to the detection or the prediction of a malfunction of the IDG 103 concerned by the injected data. The first run is implemented by virtue of the same algorithm as for the training (first algorithm), with the difference that, in production, the artificial intelligence of the machine learning type has been trained to detect or to predict by itself an IDG 103 malfunction using the injected data (data to be analyzed).

Thus, in a step 313, depending on the first run, the data analysis system obtains a prediction with regards to the malfunction of the IDG 103 in question, for the injected data, in light of the training carried out.

When the first run reveals that the injected data are indicative of a malfunction suffered by the IDG 103, the corresponding injected data are selected in a step 314 so as to be subjected to a second run in a step 315. The second run is implemented by virtue of the same algorithm as for the training (second algorithm), with the difference that, in production, the artificial intelligence of the machine learning type has been trained to find by itself the cause of the malfunction based on the injected data (data to be analyzed).

Thus, in a step 316, depending on the second run, the data analysis system obtains a prediction with regard to the cause of the malfunction of the IDG 103 in question, for the injected data, in light of the training carried out.

Thus, the data analysis system is able to determine, using data collected in flight and using the artificial intelligence of the machine learning type which has been trained as previously described, whether a malfunction of the IDG 103 has occurred or is in the process of occurring and, in which case, what is its cause. The maintenance around the IDG 103 is thus greatly facilitated.

Figure 4:
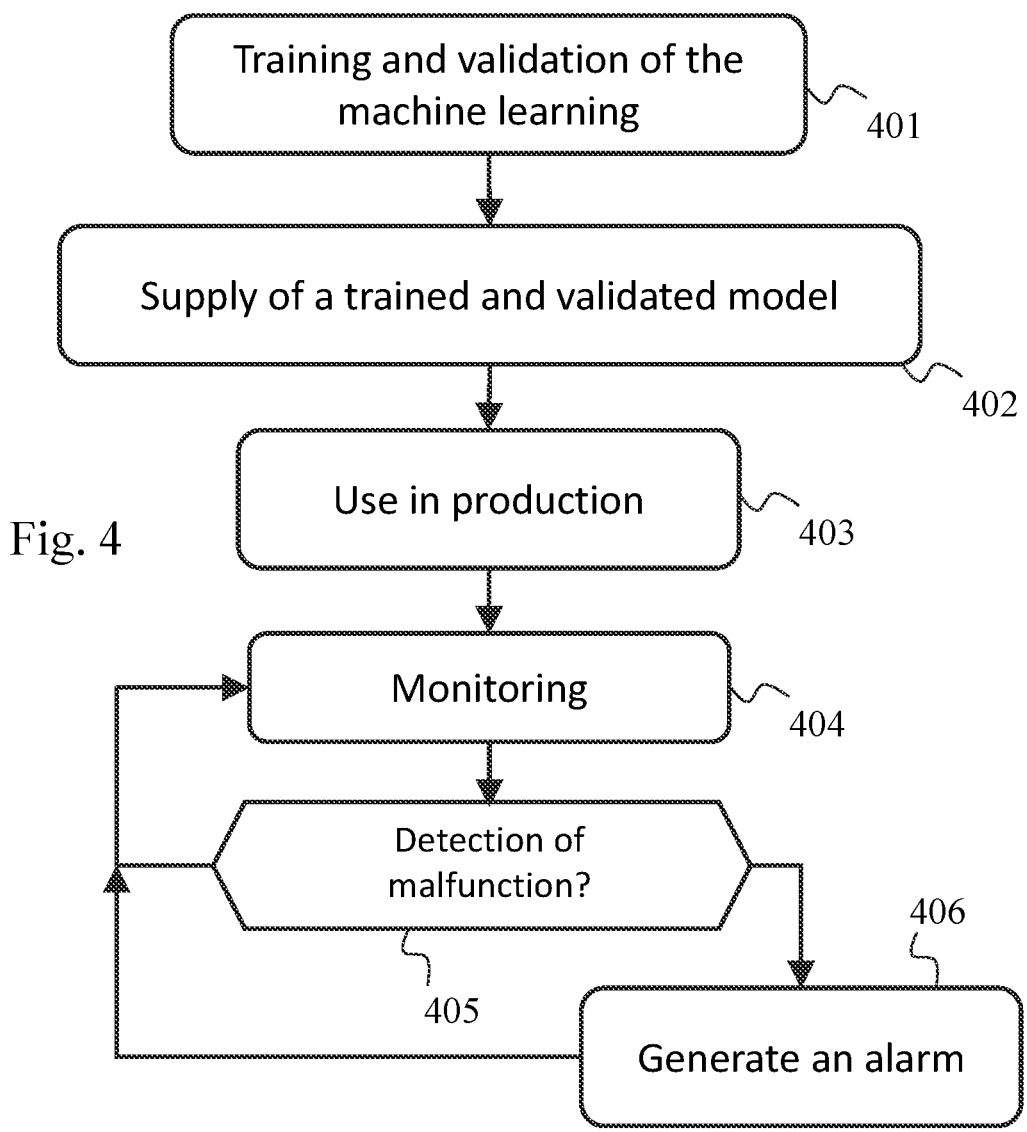
FIG. 4 illustrates schematically an algorithm for configuration and use of the artificial intelligence of the machine learning type.

FIG. 4 illustrates schematically an algorithm for configuration and for use of the artificial intelligence of the machine learning type in the framework of the data analysis system.

In a step 401, the artificial intelligence of the machine learning type is trained and validated as previously described in relation with FIGS. 2A and 2B.

In a step 402, subsequent to the training and to the validation, a trained and validated model is obtained, allowing the artificial intelligence of the machine learning type to be used in production, in a step 403.

In a step 404, a monitoring phase is carried out. The monitoring phase consists of the collection of data during flights of aircraft in order to monitor the correct operation of each IDG 103 of the said aircraft, together with the analysis of the data collected. The data collection and the analysis of the data collected are carried out as previously described in relation with FIGS. 3A and 3B.

Thus, each aircraft concerned may be equipped with the data analysis system which can preferably be integrated into the avionics 101 of the said aircraft. As a variant, the data analysis system is a computer system on the ground in a control center, for example in premises of an airline company. Then, the data to be collected are transmitted by the avionics 101 to the computer system in the control center, for example by means of ground-air communications, or by using an electronic flying bag EFB as intermediary between the avionics 101 and the computer system in the control center. The electronic flying bag EFB then uses wired communications (for example, of the USB type) or wireless communications (for example, of the Bluetooth or Wi-Fi type) for exchanges between the computer system in the control center and the avionics 101.

In a step 405, the data analysis system determines whether the analysis of the data collected shows an IDG 103 malfunction. In the affirmative, a step 406 is carried out; otherwise, the monitoring is continued in the step 404.

In the step 406, the data analysis system generates an alarm representative of the IDG 103 malfunction detected (detection by virtue of the first run). The alarm is accompanied by information indicating the assumed cause of the malfunction detected (identification by virtue of the second run). A maintenance may then be programmed, and the monitoring is continued in the step 404.

Figure 5:
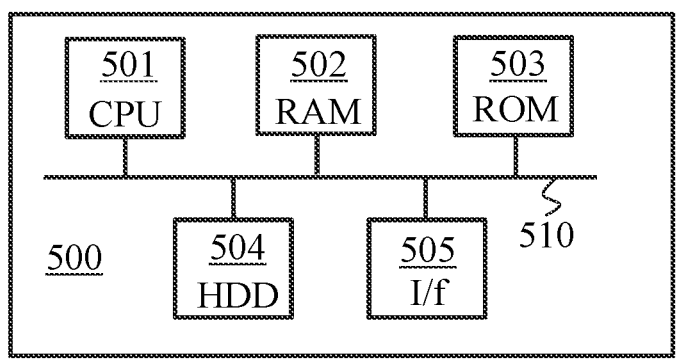
FIG. 5 illustrates schematically one example of a hardware platform configured for carrying out an implementation of the artificial intelligence of the machine learning type.

FIG. 5 illustrates schematically one example of a hardware platform 500 of the data analysis system, in the form of electronic circuitry, which is designed and configured for implementing the algorithms described hereinabove. The hardware platform 500 is thus designed and configured for implementing the artificial intelligence of the machine learning type disclosed here.

The hardware platform 500 then comprises, connected via a communications bus 510: a processor or CPU (Central Processing Unit) 501; a volatile memory RAM (Random Access Memory) 502; a non-volatile memory 503, for example of the ROM (Read Only Memory) or EEPROM (Electrically-Erasable Programmable ROM) type; a storage unit 504, such as a HDD (Hard Disk Drive), or a storage medium reader, such as an SD (Secure Digital) card reader; and an interface manager I/f 505.

The interface manager I/f 505 allows an interaction with one or more pieces of equipment of the aircraft 10, such as the aforementioned temperature sensors, and/or potentially with a communications network. For example, the interface manager I/f 505 is designed and configured to enable an interaction with the avionics 101.

The processor 501 is capable of executing instructions loaded into the volatile memory 502 from the non-volatile memory 503, from an external memory, from a storage medium (such as an SD map), or from a communications network. When the hardware platform 500 is powered up, the processor 501 is capable of reading instructions from the volatile memory 502 and of executing them. These instructions form a computer program causing the implementation, by the processor 501, of all or part of the steps and operations described here.

All or part of the steps and operations described here may thus be implemented in software form by execution of a set of instructions by a programmable machine, for example a processor of the DSP (Digital Signal Processor) type or a microcontroller, or be implemented in hardware form by a dedicated machine or an electronic component ("chip") or a dedicated set of electronic components ("chipset"), for example an FPGA (Field Programmable Gate Array) or ASIC (Application Specific Integrated Circuit) component. Generally speaking, the hardware platform 500 comprises electronic circuitry designed and configured for implementing the operations and steps described here.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for detecting a malfunction suffered by an integrated drive generator (IDG) in an aircraft, the method being implemented by a data analysis system comprising a machine learning artificial intelligence, wherein the method comprises the following steps:
    collecting reference data relating to measurements made and recorded during previous flights of aircraft equipped with IDGs, called reference IDGs, the reference data comprising at least measurements corresponding to the following parameters, for each reference IDG:
        a flow of fuel supplying a jet engine with which the respective reference IDG is associated;
        a position of a fuel return valve associated with the respective reference IDG;
        a temperature measured by a sensor on an inlet port of the respective reference IDG;
        a temperature measured by a sensor on an outlet port of the respective reference IDG;
        a frequency of electrical signal produced by the respective reference IDG;
        a temperature of oil supplying the jet engine with which the respective reference IDG is associated;
    carrying out a training, in supervisor mode, of a machine learning artificial intelligence with the reference data, with a first classification run for training to detect potential malfunctions suffered by IDGs and a second classification run for training to determine causes of the malfunctions where relevant;
    using in production the machine learning artificial intelligence after validation of the training;
    collecting data to be analyzed, the data the same type as the reference data, relating to measurements made and recorded during flights of the aircraft comprising the IDG; and,
    using the machine learning artificial intelligence that has been trained to predict a potential malfunction suffered by the IDG and predict, where relevant, a cause of the malfunctions by virtue, respectively, of the said first and second classification runs, using the data to be analyzed.

2. The method according to claim 1, wherein the reference data further comprise measurements corresponding to at least one of the following parameters, for each reference IDG:

a time during which the fuel return valve is open;
a time during which the fuel return valve is closed;
a ratio between the time during which the fuel return valve is closed and the time during which the fuel return valve is open;
a time taken by the fuel return valve to go from a closed position to an open position; and
a difference in temperature between the inlet port of the respective reference IDG and the outlet port of the respective reference IDG.

3. The method according to claim 1, wherein the data analysis system processes the reference data and to the data to be analyzed by, at least, calculating the following information, for one or more of the said parameters:
a minimum value;
a maximum value;
a standard deviation;
an average;
a moving average;
a gradient coefficient; or
any combination thereof.

4. The method according to claim 3, wherein the calculating of at least a part of the said information is carried out by grouping reference data and, respectively, data to be analyzed, over several consecutive aircraft flights.

5. The method according to claim 1, wherein the machine learning artificial intelligence is trained to detect an IDG malfunction linked to:
an anomaly in the opening/closing controls of a fuel return valve;
a clogging of IDG oil;
a failure of a temperature sensor on the outlet port;
a failure of a temperature sensor on the inlet port;
an oil leak in an IDG;
an anomaly of IDG maintenance;
or any combination thereof.

6. The method according to claim 1, wherein the first classification run comprises applying a first algorithm and the second classification run comprises applying a second algorithm distinct from the first algorithm.

7. The method according to claim 6, wherein the first algorithm comprises an LightGBM algorithm and the second algorithm comprises an XGBooost algorithm.

8. The method according to claim 1, wherein the machine learning artificial intelligence is used in production in an avionics system of the aircraft equipped with the IDG.

9. The method according to claim 1, wherein the machine learning artificial intelligence is used in production in a computer system on the ground in a control center, and wherein the data to be analyzed are transmitted by an avionics system of the aircraft, equipped with the IDG, to the computer system in the control center.

10. A non-transitory computer readable storage medium comprising:
a computer program comprising instructions which, when executed by a processor, performs the method according to claim 1.

11. A system comprising:
an electronic circuitry configured to carry out a detection of a malfunction suffered by an integrated drive generatot (IDG) to be monitored, in an aircraft, wherein the electronic circuitry is configured to:
collect reference data relating to measurements made and recorded during previous flights of aircraft equipped with reference IDGs, the reference data comprising at least measurements corresponding to the following parameters, for each reference IDG:
a flow of fuel supplying a jet engine with which the respective reference IDG is associated;
a position of a fuel return valve associated with the respective reference IDG;
a temperature measured by a sensor on an inlet port of the respective reference IDG;
a temperature measured by a sensor on an outlet port of the respective reference IDG;
a frequency of electrical signal produced by the respective reference IDG;
a temperature of oil supplying the jet engine with which the respective reference IDG is associated; and
combinations thereof;
carry out a training, in supervisor mode, of a machine learning artificial intelligence with the reference data, with a first classification run for training to detect potential malfunctions suffered by IDGs and a second classification run for training to determine causes of the malfunctions, where relevant;
use in production the machine learning artificial intelligence after validation of the training;
collect data to be analyzed, the data being the same as the reference data, relating to measurements made and recorded during flights of the aircraft comprising the IDG to be monitored; and
use the machine learning artificial intelligence that has been trained to predict a potential malfunction suffered by the IDG to be monitored and predict, where relevant, a cause of the malfunction with, respectively, the said first and second runs, using the data to be analyzed.

* * * * *